United States Patent
Yano (10) Patent No.: US 11,100,983 B2
(45) Date of Patent: Aug. 24, 2021

(54) ELECTRON DEVICE AND DATA PROCESSING METHOD USING CROSSBAR ARRAY

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 3 days.

(21) Appl. No.: 16/860,022

(22) Filed: Apr. 27, 2020

(65) Prior Publication Data

US 2021/0158869 A1    May 27, 2021

(30) Foreign Application Priority Data

Nov. 22, 2019 (JP) .............................. JP2019-211474

(51) Int. Cl.
*G11C 11/00* (2006.01)
*G11C 13/00* (2006.01)

(52) U.S. Cl.
CPC ........ *G11C 13/0026* (2013.01); *G11C 13/003* (2013.01); *G11C 13/0028* (2013.01); *G11C 13/0069* (2013.01); *G11C 2013/0078* (2013.01); *G11C 2213/72* (2013.01)

(58) Field of Classification Search
CPC . G11C 11/00; G11C 13/0026; G11C 13/0028; G11C 13/003; G11C 13/0069; G11C 2013/0078; G11C 2213/72
USPC .......................................................... 365/148
See application file for complete search history.

(56) References Cited

U.S. PATENT DOCUMENTS

| | | | |
|---|---|---|---|
| 9,401,473 B2 * | 7/2016 | Tan | ...... H01L 27/2409 |
| 9,847,377 B2 * | 12/2017 | Tan | ...... H01L 45/146 |
| 9,911,788 B2 * | 3/2018 | Yang | ...... H01L 45/16 |
| 2018/0075904 A1 | 3/2018 | Ge et al. | |

FOREIGN PATENT DOCUMENTS

| | | |
|---|---|---|
| CN | 108780492 | 11/2018 |
| JP | 2018501536 | 1/2018 |
| KR | 20180101276 | 9/2018 |
| KR | 20190069552 | 6/2019 |
| TW | 201614655 | 4/2016 |

OTHER PUBLICATIONS

"Office Action of Korea Counterpart Application", dated Mar. 29, 2021, with English translation thereof, p. 1-p. 10.

* cited by examiner

*Primary Examiner* — Harry W Byrne
(74) *Attorney, Agent, or Firm* — JCIPRNET (57) ABSTRACT

An electron device using a crossbar array and capable of implementing a high-speed and high-reliability process is provided. An operational processing device (100) includes a crossbar array (110); a row selecting/driving circuit (120) electrically coupling to a row line; a column selecting/driving circuit (130) electrically coupling to a column line; and a control part (140) controlling each part. The control part (140) is capable of applying, from the row selecting/driving circuit (120), an output signal received by the row selecting/driving circuit (120) or applying, from the column selecting/driving circuit (130), an output signal received by the column selecting/driving circuit (130).

15 Claims, 6 Drawing Sheets

ELECTRON DEVICE AND DATA PROCESSING METHOD USING CROSSBAR ARRAY

CROSS-REFERENCE TO RELATED APPLICATION

This application claims the priority benefit of Japan application serial no. 2019-211474, filed on Nov. 22, 2019. The entirety of the above-mentioned patent application is hereby incorporated by reference herein and made a part of this specification.

BACKGROUND

Technical Field

The disclosure relates to an electron device using a crossbar array, and in particular, to a crossbar array including nonvolatile resistance-variable memory elements at crosspoints of the crossbar array.

Description of Related Art

At present, Artificial Intelligence (AI) is being studied to be applied in various fields and promote practicability thereof. Semiconductor memory manufacturers want to implement a neural network serving as AI hardware analogous to a synapse and a neuron in structure. A crossbar array is being studied to serve as a device implementing such a neural network.

Figure 1:
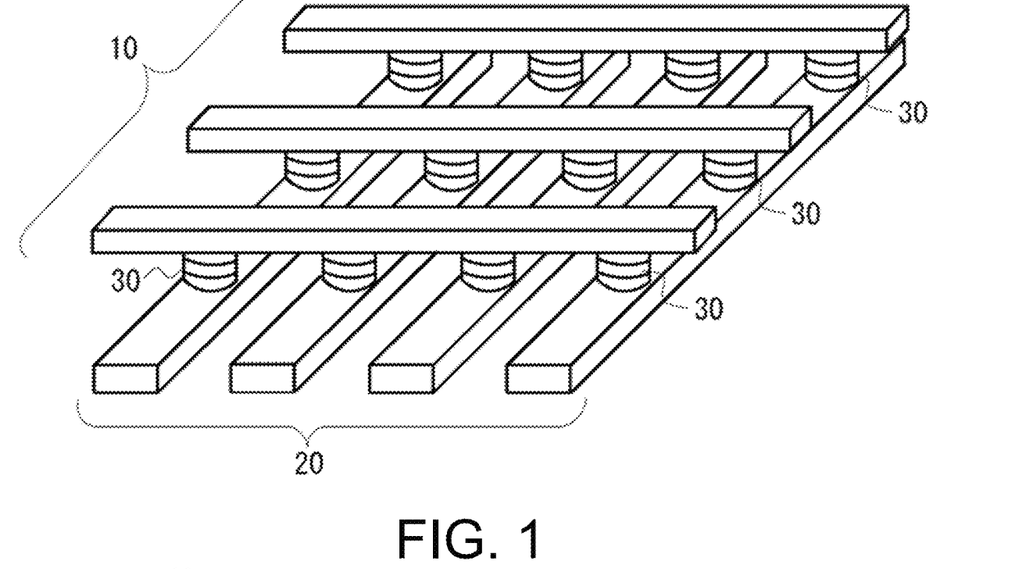
FIG. 1 is a three-dimensional diagram showing an example of an existing crossbar array using memristors.

FIG. 1 shows an example of a crossbar array or a crossbar memory. As shown in this figure, the crossbar array includes a plurality of row lines 10 extending in a row direction, a plurality of column lines 20 extending in a column direction in a way of being orthogonal thereto, and memristors 30 coupling to cross parts of each row line 10 and each column line 20. The memristors 30, for example, are nonvolatile resistance-variable memory elements for programming different resistance states by applying voltages or currents. By programming expected resistance values to the resistance-variable memory elements, an input voltage applied to each row line 10 is weighted by conductance (the resistance values) of the resistance-variable memory elements and output as a merged current flowing in the column lines 20. This crossbar array is suitable for high-speed and good-efficiency vector row-column operational processing, for example, neural networks, data compression, encryption, digital data processing and other vector operation processing.

Figure 2:
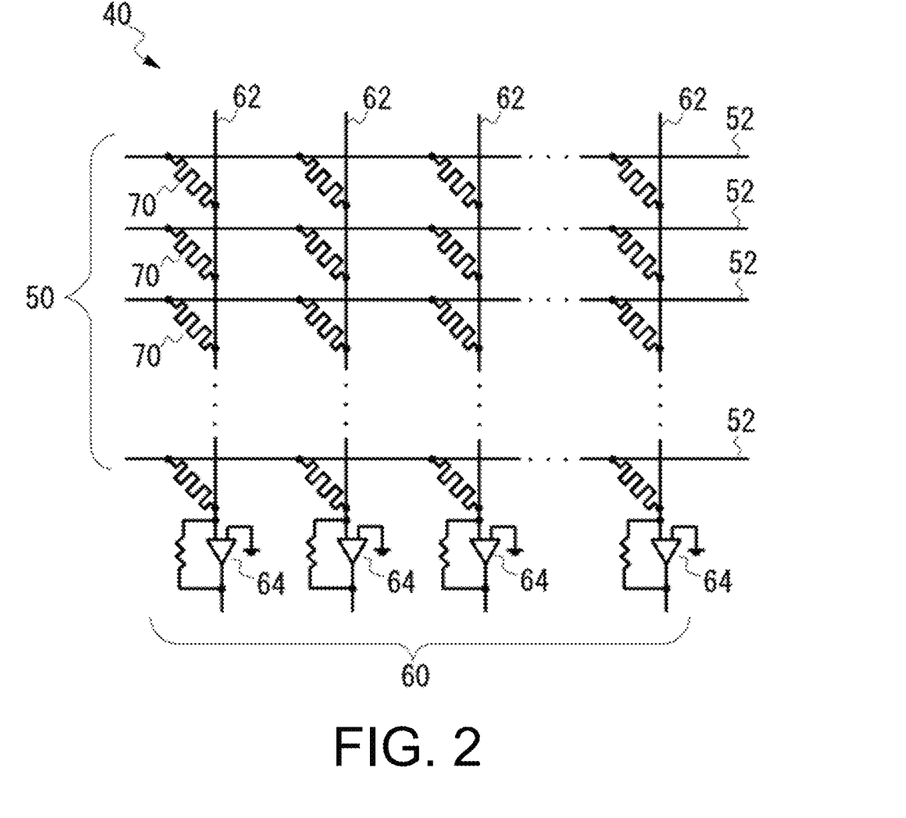
FIG. 2 is a diagram showing an example of a row-column operation circuit utilizing an existing crossbar array.

For example, Patent Literature 1 discloses a dot product engine for vector processing using a crossbar array. As shown in FIG. 2, the dot product engine includes an N-row× M-column crossbar array 40. A vector input part 50 is coupled to each row electrode 52. A vector output part 60 is coupled to each column electrode 62. Memristors 70 are coupled to cross parts of each row electrode 52 and each column electrode 62. The vector input part 50 uses an address decoder to select the row electrodes 52 and drives drivers corresponding to the selected row electrodes 52. The vector output part 60 includes sensing circuits 64 configured to convert currents of the column electrodes 62 into voltages. A vector row-column multiplication is performed by applying a set of voltages to each row electrode 52 of the N×M crossbar array, collecting currents flowing in the column electrodes 62 and measuring output voltages. In each column electrode 62, all input voltages are weighted by conductance of the corresponding memristors, and a weighted total thereof is reflected in the output voltages.

EXISTING TECHNICAL LITERATURE

Patent Literature

[Patent Literature 1] Japanese Laid Open Patent Publication No. 2018-501536

SUMMARY

Problems to be Solved by the Invention

Figure 3:
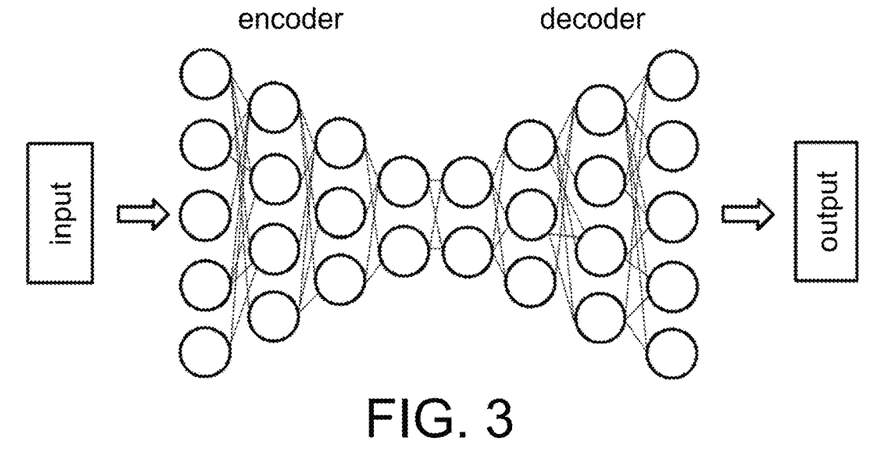
FIG. 3 is a diagram showing an example of an automatic encoder utilizing a neural network.

For example, as shown in FIG. 3, an automatic encoder utilizing a neural network, for example, has the following structure: inputting features of an object to be identified, and outputting what it is at a high probability according to the features. The automatic encoder includes a plurality of encoder layers and a plurality of decoder layers between an input and an output, and weighting or symbols of encoders and decoders are adjusted according to learning results and the like. For example, when a crossbar array is utilized to implement the automatic encoder or a portion thereof, the crossbar array processes each layer of the encoders and each layer of the decoders between the input and the output. That is, output signals processed in an $i^{th}$ layer must be input into the next $(i+1)^{th}$ layer, output signals processed in the $(i+1)^{th}$ layer are input into the next $(i+2)^{th}$ layer, and this process is repeated in turn.

However, as shown in FIG. 2, a crossbar array is a structure including input parts at an end of one side in a row direction of the array and including output parts at an end of one side in a column direction. In order to apply output signals received by the output parts in the column direction to an input part of the next layer, signals from the output parts in the column direction to the input parts in the row direction must be carried. Output signals of the crossbar array reflect resistance weighting utilizing memristors, and therefore it is extremely ideal that signal degradation (for example, voltage drop or noise) caused by signal carrying is avoided. In addition, delay caused by signal carrying from the output parts in the column direction to the input parts in the row direction also affects processing time of the crossbar array.

The invention solves this existing problem, and is directed to provide an electron device and a data processing method using a crossbar array and capable of implementing a high-speed and high-reliability process.

Technical Means for Solving Problems

An electron device using a crossbar array of the invention includes: the crossbar array, including m row lines extending in a row direction, n column lines extending in a column direction, and resistance-variable memory elements coupling to each cross part of the m row lines and the n column lines; a row side circuit, electrically coupling to the m row lines; a column side circuit, electrically coupling to the n column lines; and a control component, controlling the row side circuit and the column side circuit. The row side circuit includes a row input part applying an input signal to a selected row line, and a row output part receiving an output signal from the selected row line. The column side circuit includes a column input part applying an input signal to a selected column line, and a column output part receiving an output signal from the selected column line. The control component is capable of applying, from the row input part, the output signal received from the row output part or applying, from the column input part, the output signal received from the column output part.

In an implementation, when the row input part applies a first input signal to a first selected row line and the column output part receives a first output signal corresponding to the first input signal from a first selected column line, the column input part applies a second input signal corresponding to the first output signal received by the column output part to a second selected column line. In an implementation, when the column input part applies the second input signal to the second selected column line and the row output part receives a second output signal corresponding to the second input signal from a second selected row line, the row input part applies a third input signal corresponding to the second output signal received by the row output part to a third selected row line. In an implementation, the row side circuit further includes a first input switching circuit, and the first input switching circuit supplies any one of an output signal received by the row output part or an input signal supplied from the control component to the row input part. The column side circuit further includes a second input switching circuit, and the second input switching circuit supplies any one of an output signal received by the column output part or the input signal supplied from the control component to the column input part. In an implementation, the row side circuit further includes a first output switching circuit, and the first output switching circuit outputs an output signal received by the row output part towards the row input part or the control component. The column side circuit further includes a second output switching circuit, and the second output switching circuit outputs an output signal received by the column output part towards the column input part or the control component. In an implementation, the row side circuit further includes a row selecting circuit selecting a row line according to a row selecting signal, and the column side circuit further includes a column selecting circuit selecting a column line according to a column selecting signal. In an implementation, the row output part includes a merged calculation part, merging currents flowing into one or more selected row lines; an analog-digital (AD) converter, converting analog voltages corresponding to the currents merged by the merged calculation part into digital signals; and a holding circuit, holding the digital signals converted by the AD converter. The row input part includes a digital-analog (DA) converter generating analog voltages according to the input digital signals. The column output part includes a merged calculation part, merging currents flowing into one or more selected column lines; an AD converter, converting analog voltages corresponding to the currents merged by the merged calculation part into digital signals; and a holding circuit, holding the digital signals converted by the AD converter. The column input part includes a DA converter generating analog voltages according to the input digital signals. In an implementation, the crossbar array includes a plurality of arrays, disposed in row and column directions; and switching circuits, disposed between adjacent arrays and performing electric coupling or non-coupling switching between the arrays in the row and column directions. In an implementation, the row side circuit is disposed at an end of one side in the row direction of the crossbar array, and the column side circuit is disposed at an end of one side in the column direction of the crossbar array. In an implementation, the control component includes a programming component programming resistance values of resistance-variable memory elements through the selected row lines and the selected column lines. In an implementation, the programming component applies programming pulses of selected polarities to low-resistance-variable memory elements through the selected row lines and the selected column lines. In an implementation, the control component controls the programming component corresponding to weighting of the resistance-variable memory elements.

In a processing method of the invention for signals in an electron device using a crossbar array, the crossbar array includes m row lines extending in a row direction, n column lines extending in a column direction, and resistance-variable memory elements coupling to each cross part of the m row lines and the n column lines. The m row lines of the crossbar array are electrically coupled to a row side circuit, and the n column lines are electrically coupled to a column side circuit. A first input signal is applied to a first selected row line of the row side circuit, and a first output signal corresponding to the first input signal is output from a first selected column line of the column side circuit. A second input signal corresponding to the first output signal is applied to a second selected column line of the column side circuit, and a second output signal corresponding to the second input signal is output from a second selected row line of the row side circuit.

In an implementation, the processing method further applies a third input signal corresponding to the second output signal to a third selected row line of the row side circuit, outputs a third output signal corresponding to the third input signal from a third selected column line of the column side circuit, applies a fourth input signal corresponding to the third output signal to a fourth selected column line of the column side circuit, and outputs a fourth output signal corresponding to the fourth input signal from a fourth selected row line of the row side circuit. In an implementation, the processing method further includes applying programming voltages to the selected row lines and the selected column lines to program resistance values of the resistance-variable memory elements.

Effects of the Invention

According to the invention, the output signal received from the row output part may be applied from the row input part, or the output signal received from the column output part may be applied from the column input part, thus suppressing the signal degradation of the input/output signal and performing the high-reliability high-speed process.

DESCRIPTION OF THE EMBODIMENTS

Implementations of the invention are illustrated in detail by reference to drawings. In an exemplary implementation, a crossbar array is used as a device for constituting a neural network as AI hardware. In addition, cross parts in rows and columns of the crossbar array include resistance-variable memory elements as memristors, and the resistance-variable memory elements can store different resistance states by applying currents or voltages with different polarities. The stored resistance states may represent two values, or may also represent a plurality of values, and may also be analog resistance values. In an exemplary implementation, a crossbar array is loaded into a computer device or a computer system to be responsible for at least a portion of data processing or operational processing performed by a microprocessor or a central processing unit (CPU) and the like.

Embodiments

Figure 4:
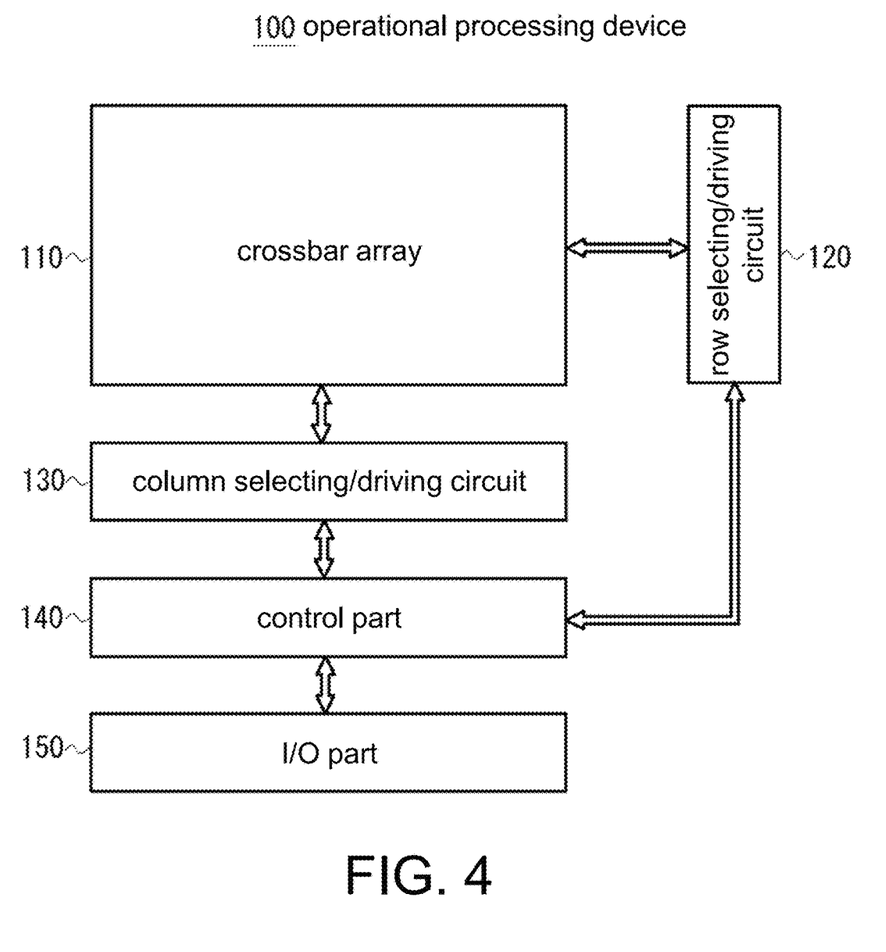
FIG. 4 is a block diagram showing an example of an operational processing device according to an embodiment of the invention.

FIG. 4 is a block diagram showing a structural example of an operational processing device of the present embodiment. An operational processing device 100 of the present embodiment includes a crossbar array 110, a row selecting/driving circuit 120, a column selecting/driving circuit 130, a control part 140 and an input/output (I/O) part 150. The operational processing device 100, for example, is mounted at an AI chip or a semiconductor integrated circuit.

For example, as shown in FIG. 1, the crossbar array 110 includes a plurality of row lines extending in a row direction, a plurality of column lines extending in a column direction, and memristors (resistance-variable memory elements) coupling to cross parts of the row lines and the column lines. Numbers, shapes, conductive materials, etc. of the row lines and the column lines are arbitrary. In addition, the crossbar array 110 may also be formed by stacking a plurality of pairs of crossbar arrays in a vertical direction with the crossbar array shown in FIG. 1 as one pair.

The row selecting/driving circuit 120 selects a row line of the crossbar array 110 according to a row selecting signal from the control part 140, and applies an input voltage to the selected row line, or senses a current flowing in the selected row line. As described below, the row selecting/driving circuit 120 of the present embodiment has the following input/output functions: applying an input signal to a selected row, receiving an output signal from the selected row, and applying the output signal to the selected row. The input/output functions are controlled by the control part 140.

The column selecting/driving circuit 130 selects a column line of the crossbar array 110 according to a column selecting signal from the control part 140, and applies an input voltage to the selected column line, or senses a current flowing in the selected column line. The column selecting/driving circuit 130 of the present embodiment has the following input/output functions: applying an input signal to a selected column, receiving an output signal from the selected column, and applying the output signal to the selected column. The input/output functions are controlled by the control part 140.

The control part 140 includes hardware and/or software, controlling operating of each part. In an implementation, the control part 140 includes a microcontroller, a microprocessor, or a state machine including a read only memory (ROM)/random access memory (RAM), for example, controlling operating of each part by executing the software stored in the ROM/RAM. The control part 140 performs various controls using the crossbar array 110 to perform operational processing. For example, outputting a row selecting signal for selecting a row to the row selecting/driving circuit 120, or outputting a column selecting signal for selecting a column to the column selecting/driving circuit 130, or outputting an input signal for operation or a control signal for programming the resistance-variable memory elements to the row selecting/driving circuit 120 or the column selecting/driving circuit 130, or receiving an output signal subjected to operational processing from the row selecting/driving circuit 120 or the column selecting/driving circuit 130.

The input/output part 150, for example, is coupled to the control part 140 through an internal data bus, and provides data received from the outside to the control part 140, or outputs data received from the control part 140 towards the outside.

Then, an operating principle of a crossbar array of the present embodiment is illustrated by reference to FIG. 5. A crossbar array 110 is set as the following crossbar array herein: having six row lines ROW1 to ROW6, eight column lines COL1 to COL8, and resistance-variable memory elements coupling to cross parts of the row lines and the column lines. As an operating example, when the row line ROW2 and the row line ROW3 are selected and an input voltage as an "input 1" is applied to the selected row line ROW2 and row line ROW3, the column line COL1 and the column line COL2 are selected by a control part 140, and a current as an "output 1" is output from the selected column line COL1 and column line COL2. An output current ICOL1 of the column line COL1 is merging of a current I21 flowing in from the row line ROW2 through the resistance-variable memory elements and a current I31 flowing in from the row line ROW3 through the resistance-variable memory elements. An output current ICOL2 of the column line COL2 is merging of a current I22 flowing in from the row line ROW2 through the resistance-variable memory elements and a current I32 flowing in from the row line ROW3 through the resistance-variable memory elements.

According to the Ohm's law, the current I21 is determined by a voltage V2 applied into the row line ROW2 and a resistance value R21 (resistance of lines is ignored for illustration purposes herein) of the resistance-variable memory elements (I21=V2/R21). Similarly, the current I31 is determined by a voltage V3 applied into the row line ROW3 and a resistance value R31 of the resistance-variable memory elements (I31=V3/R31). Therefore, the output current of the column line COL1 meets ICOL1=I21+I31=V2/R21+V3/R31. Similarly, the output current of the column line COL2 meets ICOL2=I22+I32=V2/R22+V3/R32.

Then, the column line COL5 is selected, and an input voltage as an "input 2" is applied to the selected column line COL5. The input voltage as the "input 2" corresponds to the output current as the "output 1". That is, the "output 1" is a merged current of the output current ICOL1 and the output current ICOL2, and the merged current is converted into a voltage to serve as the input voltage as the "input 2". When the "input 2" is applied to the selected column line COL5, the row line ROW4 and the row line ROW5 are selected by the control part 140, and a current as an "output 2" is output from the selected row line ROW4 and row line ROW5. The "output 2" is a merged current of an output current IROW4 of the row line ROW4 and an output current IROW5 of the row line ROW5.

Then, the row line ROW6 is selected, and an input voltage as an "input 3" is applied to the selected row line ROW6. The input voltage as the "input 3" corresponds to the output current as the "output 2", and the output current as the "output 2" is converted into a voltage to serve as the input voltage as the "input 3". When the voltage as the "input 3" is applied to the selected row line ROW6, the column line COL6, the column line COL7 and the column line COL8 are selected by the control part 140, and a current as an "output 3" is output from the selected column line COL6, column line COL7 and column line COL8. The "output 3" is a merged current of an output current ICOL6, an output current ICOL7 and an output current ICOL8 of the column line COL6, the column line COL7 and the column line COL8.

Then, the column line COL3 and the column line COL4 are selected, and an input voltage as an "input 4" is applied to the selected column line COL3 and column line COL4. The input voltage as the "input 4" corresponds to the output current as the "output 3", and the output current as the "output 3" is converted into a voltage to serve as the input voltage as the "input 4". When the "input 4" is applied to the selected column line COL3 and column line COL4, the row line ROW1 is selected by the control part 140, and a current as an "output 4" is output from the selected row line ROW1. The "output 4" is a merged current of currents flowing into the row line ROW1 from the column line COL3 and the column line COL4.

The "input 1" corresponds to an input layer, the "output 4" corresponds to an output layer, and the "input 2", the "input 3", the "output 2" and the "output 3" correspond to middle layers between the input layer and the output layer herein.

In this way, in the present embodiment, the crossbar array can implement input and output from the row lines, and can implement input and output from the column lines. Thus, an output signal output from the row lines may be directly input into a row line as the next layer, or an output signal output from the column lines may be directly input into a column line as the next layer. Therefore, there is no need of carrying an output signal from the row lines towards the column lines or carrying an output signal from the column lines towards the row lines, thus suppressing degradation (voltage drop or noise) of an output signal or an input signal, and shortening time before inputting and outputting signals, so that operational processing time is further shortened. Further, flexible use of the crossbar array may be implemented, and therefore, an unused area of the array may be reduced to reach effective utilization of the array.

Figure 6A:
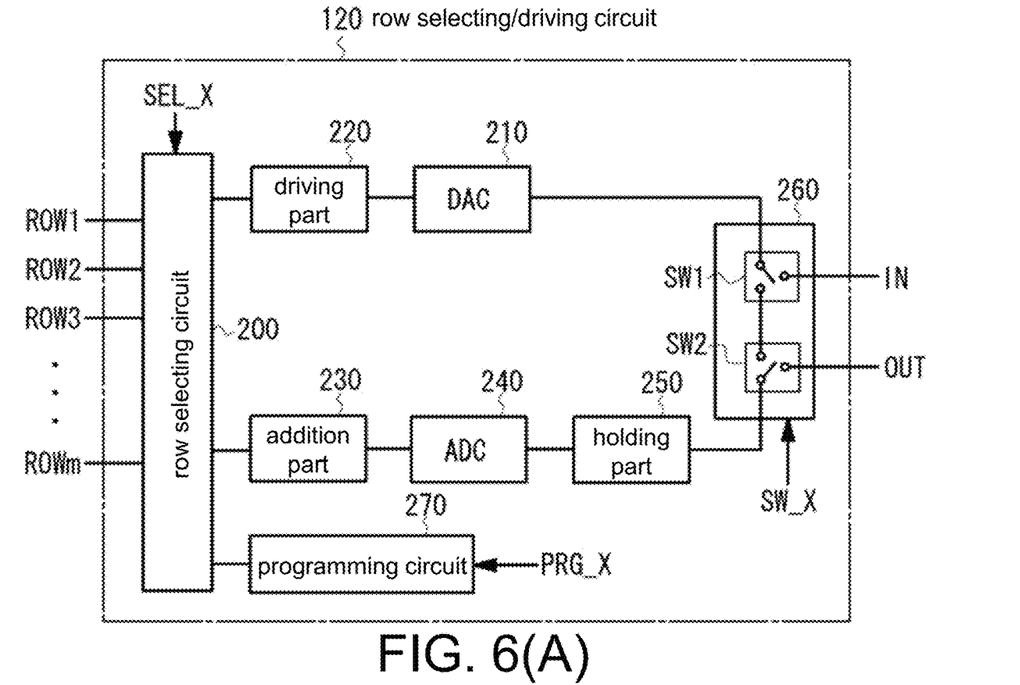
FIG. 6(A) and FIG. 6(B) are diagrams showing structures of a row selecting/driving circuit and a column selecting/driving circuit according to an embodiment of the invention.

Then, a specific example of a row selecting/driving circuit 120 is shown in FIG. 6(A). As shown in this figure, the row selecting/driving circuit 120 includes: a row selecting circuit 200, selecting one or more row lines according to a row selecting signal SEL_X; a digital/analog converter (DAC) 210, generating an analog voltage according to an input digital signal of k bits; a driving part 220, applying the analog voltage generated by the DAC 210 to a selected row line as an input voltage; an addition part 230, receiving an output current flowing in the selected row line, merging a plurality of output currents when a plurality of row lines are selected and generating a voltage corresponding to a merged output current; an analog/digital converter (ADC) 240, converting the analog output voltage generated by the addition part 230 into a digital signal of k bits; a holding part (for example, a register) 250, holding the digital signal output from the ADC 240; an input/output switching part 260; and a programming circuit 270.

The input/output switching part 260 includes a switch SW1 performing input switching, and a switch SW2 performing output switching. The switch SW1 and the switch SW2 are switched according to a switching control signal SW_X from a control part 140. The switch SW1 includes a first input terminal inputting a digital signal output from the control part 140, a second input terminal inputting a digital signal output from the switch SW2, and an output terminal outputting the digital signal from the first input terminal or the second input terminal to the DAC 210. The switch SW2 includes an input terminal coupled to the holding part 250, a first output terminal coupled to the control part 140, and a second output terminal coupled to the input terminals of the switch SW1, and outputs a digital signal input to the input terminal towards the switch SW1 or the control part 140.

Figure 6B:
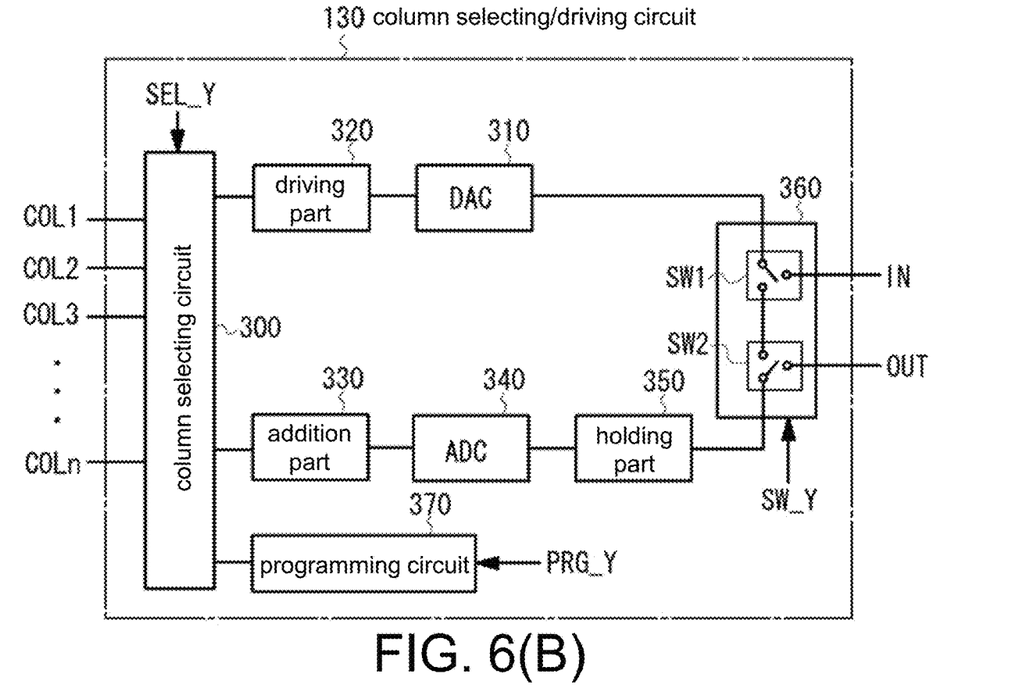

When programming resistance-variable memory elements selected by a crossbar array to be in a low-resistance state or a high-resistance state, the programming circuit 270 applies an expected bias voltage to the row line selected by the row selecting circuit 200 according to a programming control signal PRG_X from the control part 140. In this case, a programming circuit 370 of a column selecting/driving circuit 130 also applies an expected bias voltage to a column line selected by a column selecting circuit 300 according to a programming control signal PRG_Y from the control part 140. Thus, a bias voltage is applied to the resistance-variable memory element of a cross part of one selected row line and one selected column line. The resistance-variable memory elements are programmed to be in the low-resistance state or the high-resistance state by making polarities of the bias voltages different.

Resistance values of the resistance-variable memory elements, for example, generate weighting or a weighting coefficient of a neural network like an automatic encoder. For example, when the programming circuit 270 applies a bias voltage as a pulse signal, the control part 140 controls application time of the pulse signal and the number of times of application of the pulse signal, thereby adjusting weighting or making weighting variable.

Then, a specific example of a column selecting/driving circuit 130 is shown in FIG. 6(B). As shown in this figure, the column selecting/driving circuit 130 is constituted basically the same as the row selecting/driving circuit 120. That is, the column selecting/driving circuit 130 includes: a column selecting circuit 300, selecting one or more column lines according to a column selecting signal SEL_Y; a digital/analog converter (DAC) 310, generating an analog voltage according to an input digital signal of k bits; a driving part 320, applying the analog voltage generated by the DAC 310 to a selected column line as an input voltage; an addition part 330, receiving an output current flowing in the selected column line, merging a plurality of output currents when a plurality of column lines are selected and generating a voltage corresponding to a merged output current; an analog/digital converter (ADC) 340, converting the analog output voltage generated by the addition part 330 into a digital signal of k bits; a holding part (for example, a register) 350, holding the digital signal output from the ADC 340; an input/output switching part 360, switching a switch SW1 and a switch SW2 according to a switching control signal SW_Y from a control part 140; and a programming circuit 370, programming resistance values of selected resistance-variable memory elements according to a programming control signal PRG_Y from the control part 140.

The row selecting/driving circuit 120 may receive an output current from a row direction and apply an input voltage corresponding to the output current from the row direction. Similarly, the column selecting/driving circuit 130 may receive an output current from a column direction and apply an input voltage corresponding to the output current from the column direction.

Figure 5:
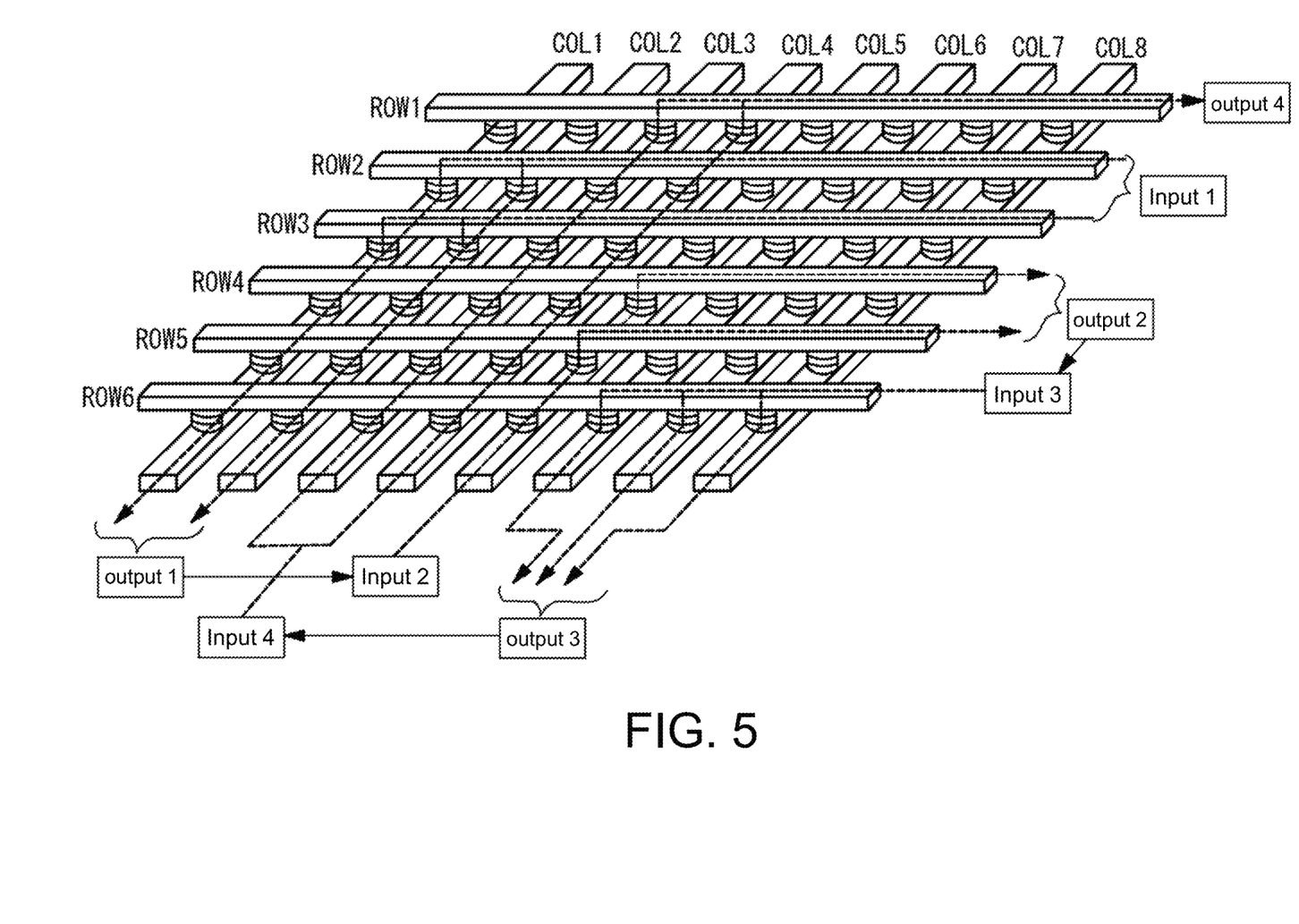
FIG. 5 is a diagram illustrating an operating principle of a crossbar array according to an embodiment of the invention.

Then, operating of the row selecting/driving circuit 120 and the column selecting/driving circuit 130 is illustrated while referring to the operating example in FIG. 5. As shown in FIG. 5, when the "input 1" is applied to the crossbar array, the control part 140 supplies the digital signal of k bits representing an input voltage to the DAC 210 through the switch SW1 of the input/output switching part 260, and the DAC 210 converts the digital signal of the k bits into the analog voltage. The row selecting circuit 200 selects two row lines ROW2 and ROW3 according to the row selecting signal SEL_X from the control part 140, and the driving part 220 applies the analog voltage generated by the DAC 210 into the two selected row lines ROW2 and ROW3 as the "input 1".

The control part 140 further outputs the column selecting signal SEL_Y to the column selecting circuit 300 for obtaining an "output 1" relative to the "input 1", and the column selecting circuit 300 selects a column line COL1 and a column line COL2. The column line COL1 generates an output current ICOL1, and the output current ICOL1 corresponds to the input voltages applied to the row line ROW2 and the row line ROW3 as well as the resistance value of the resistance-variable memory element of the cross part of the row line ROW2 and the row line ROW3. The column line COL2 generates an output current ICOL2, and the output current ICOL2 corresponds to input voltages applied to the row line ROW2 and the row line ROW3 as well as resistance values of the resistance-variable memory element of the cross part of the row line ROW2 and the row line ROW3. The addition part 330 receives the two output currents ICOL1 and ICOL2 flowing in the column line COL1 and the column line COL2 through the column selecting circuit 300, merges the output currents (ICOL1+ICOL2), and generates an output voltage corresponding to a merged output current.

Then, the ADC 340 converts the output voltage into the digital signal of k bits, and the holding part 350 holds data of the k bits as the "output 1". As shown in FIG. 5, the "output 1" is then applied to a column line COL5 as an "input 2" herein. Therefore, the control part 140 controls the switch SW1 and the switch SW2 of the input/output switching part 360 by utilizing the switching control signal SW_Y, and supplies the digital signal of the k bits held by the holding part 350 to the DAC 310. Thereupon, the DAC 310 receives the digital signal of the k bits as the "output 1" held by the holding part 350, converts it into the analog voltage, and generates the "input 2". The control part 140 utilizes the column selecting signal SEL_Y to select the column line COL5 of the column selecting circuit 300 for performing processing of the "input 2", and applies an input voltage representing the "input 2" to the selected column line COL5.

The control part 140 outputs the row selecting signal SEL_X to the row selecting circuit 200 when being synchronous with the column selecting signal SEL_Y, and the row selecting circuit 200 selects a row line ROW4 and a row line ROW5 in response to the row selecting signal SEL_X. An output current IROW4 and an output current IROW5 flowing in the selected row line ROW4 and row line ROW5 are merged by the addition part 230, and the addition part 230 generates an output voltage corresponding to a merged output current, and outputs it to the ADC 240. The ADC 240 converts input the analog output voltage into a digital signal of k bits, and the holding part 250 holds the converted digital signal of the k bits as an "output 2".

Then, the "output 2" is applied to a row line ROW6 as "input 3". Therefore, the control part 140 controls the switch SW1 and the switch SW2 of the input/output switching part 260 by utilizing the switching control signal SW_X, and supplies the digital signal of the k bits held by the holding part 250 to the DAC 210. Thereupon, the DAC 210 receives the digital signal of the k bits as the "output 2" held by the holding part 250, converts it into an analog voltage, and generates an "input 3". The control part 140 utilizes the row selecting signal SEL_X to select the row line ROW6 of the row selecting circuit 200 for performing processing of the "input 3", and applies an input voltage representing the "input 3" to the selected row line ROW6.

Hereafter, the processing of "output 3" and an "input 4" is performed as described. Moreover, when a final "output 4" is processed, the control part 140 controls the switch SW1 and the switch SW2 by utilizing the switching control signal SW_X, so as to make the digital signal of the k bits held by the holding part 250 supplied to the control part 140.

Figure 7:
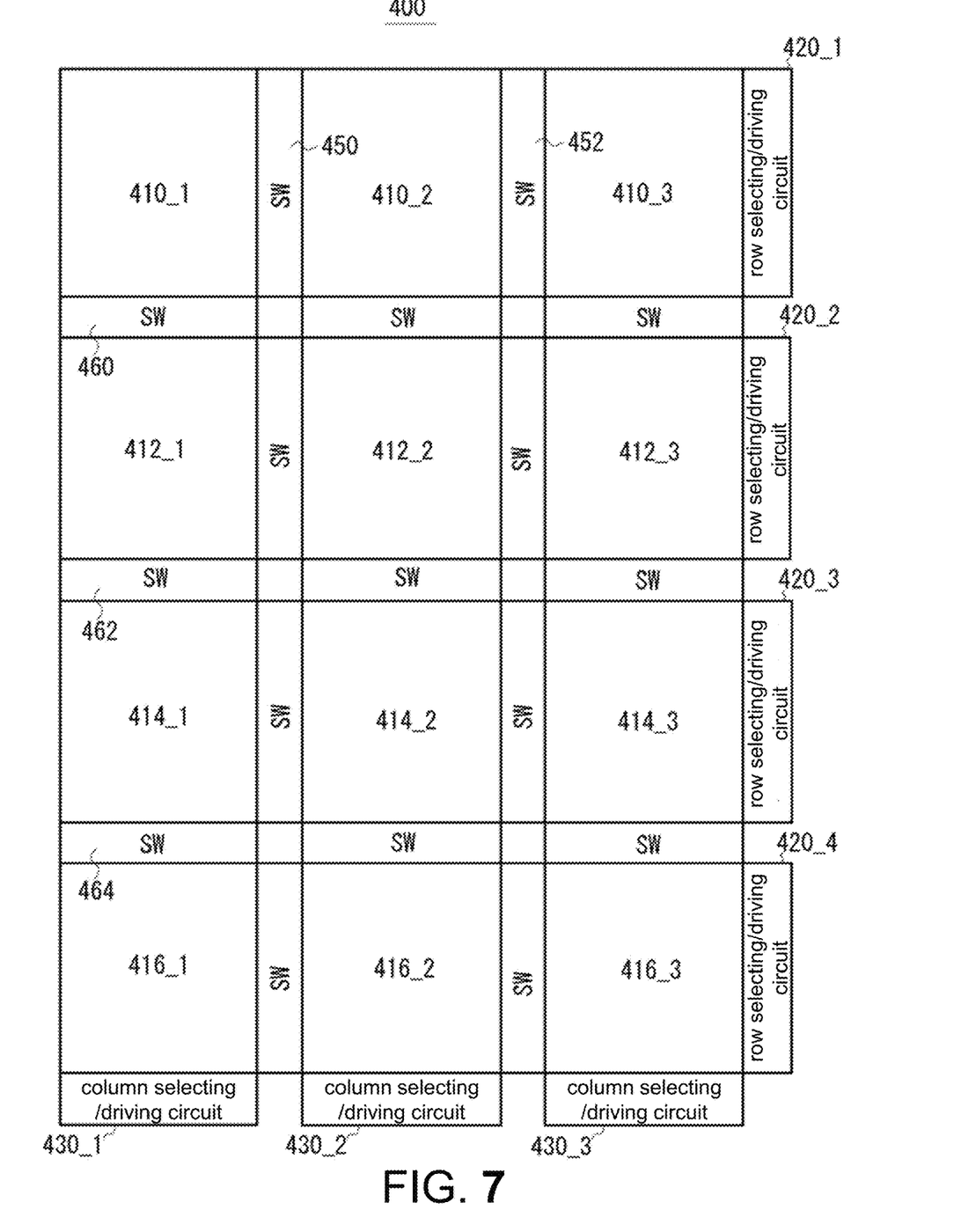
FIG. 7 is a diagram showing a structural example of a crossbar array according to a second embodiment of the invention.

Then, a second embodiment of the invention is illustrated. FIG. 7 is a schematic planar diagram of a crossbar array of a second embodiment. As shown in this figure, a crossbar array 400 of the present embodiment includes a plurality of arrays 410_1 to 416_3 (a three-row×four-column array is exemplified in the figure) disposed in row and column directions, switches SW disposed between the adjacent arrays, row selecting/driving circuits 420 (420_1 to 420_4) disposed at one end in a row direction of the crossbar array 400, and column selecting/driving circuits 430 (430_1 to 430_3) disposed at one end in a column direction.

The crossbar array shown in FIG. 5 is constituted by each array. In addition, the switches SW in the row direction perform coupling/non-coupling switching of each row line between the arrays in the row direction, and the switches SW in the column direction perform coupling/non-coupling switching of each column line between the arrays in the column direction. Switching of the switches SW is controlled by a control part 140.

The control part 140 selects one or more arrays for operation in the crossbar array 400, and at this time, the switches SW are controlled in a way of electrically coupling each row line of the selected arrays to the row selecting/driving circuits 420 and electrically coupling the column lines to the column selecting/driving circuits 430. For example, when the array 410_1 is used, the switch 450 and the switch 452 in the row direction are turned on, and the row line of the array 410_1 is electrically coupled to the row selecting/driving circuit 420_1. The switch 460, the switch 462 and the switch 464 in the column direction are turned on, and the column line of the array 410_1 is electrically coupled to the column selecting/driving circuit 430_1. Other unused array 412_2, array 412_3, array 414_2, array 414_3, array 416_2 and array 416_3 are isolated from the row selecting/driving circuits 420_2 to 420_4 as well as the column selecting/driving circuit 430_2 and the column selecting/driving circuit 430_3. The row selecting/driving circuits 420 and the column selecting/driving circuits 430 are operated selectively corresponding to the arrays used, so that power consumption may be reduced.

Figure 8:
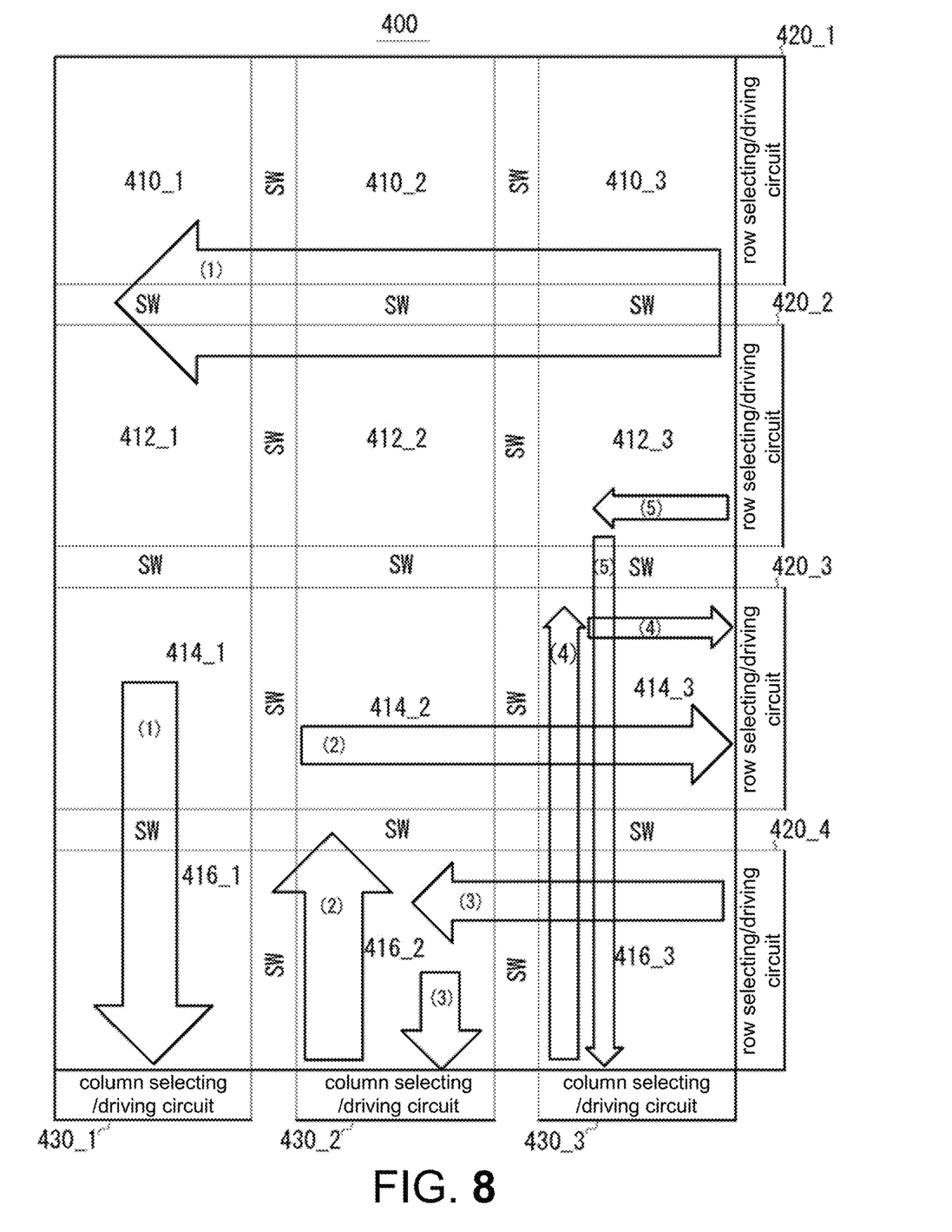
FIG. 8 is a diagram showing an operating example when using the crossbar array shown in FIG. 7.

FIG. 8 is a utilization example of operation of the crossbar array shown in FIG. 7. In the figure, (1), (2), (3), (4) and (5) denote a processing order, and arrows denote arrays used. For example, processing (1) uses the array 410_1 and the array 412_1, processing (2) uses the array 414_2, processing (3) uses the array 416_2, processing (4) uses the array 414_3, and processing (5) uses the array 412_3. The control part 140 controls on/off of the switches SW corresponding to the processing order, and controls the selected row selecting/driving circuits and the selected column selecting/driving circuits.

In this way, according to the present embodiment, the row selecting/driving circuits of the crossbar array have a function of inputting signals output from selected row lines into the selected row lines, and the column selecting/driving circuits have a function of inputting signals output from column lines into the selected column lines, so that inputting is performed without output degradation, and reliability of operational processing and a processing speed may be increased.

In the embodiments described, a crossbar array forming row lines on an upper layer and forming column lines on a lower layer is exemplified, but as an example, the crossbar array may also form column lines on an upper layer, and form row lines on a lower layer. Then, the crossbar array is not limited to a two-dimensional structure, and may also be a three-dimensional structure. For example, in a crossbar array of a three-dimensional structure, a plurality of row lines extending in a horizontal direction are disposed in a vertical direction, a plurality of column lines extending in the vertical direction are disposed in the horizontal direction, and resistance-variable memory elements are formed at cross parts of the row lines and the column lines.

Although the preferred embodiments of the invention have been described in detail, the invention is not limited to the specific embodiments, and various modifications and changes may be made within the scope of the gist of the invention described in the claims.

What is claimed is:

1. An electron device using a crossbar array, comprising:
   the crossbar array, comprising m row lines extending in a row direction, n column lines extending in a column direction, and resistance-variable memory elements coupling to each cross part of the m row lines and the n column lines;
   a row side circuit, electrically coupling to the m row lines;
   a column side circuit, electrically coupling to the n column lines; and
   a control component, controlling the row side circuit and the column side circuit, wherein
   the row side circuit comprises a row input part applying an input signal to a selected row line, and a row output part receiving an output signal from the selected row line,
   the column side circuit comprises a column input part applying an input signal to a selected column line, and a column output part receiving an output signal from the selected column line, and
   the control component is capable of applying, from the row input part, the output signal received from the row output part or applying, from the column input part, the output signal received from the column output part.

2. The electron device according to claim 1, wherein when the row input part applies a first input signal to a first selected row line and the column output part receives a first output signal corresponding to the first input signal from a first selected column line, the column input part applies a second input signal corresponding to the first output signal received by the column output part to a second selected column line.

3. The electron device according to claim 2, wherein when the column input part applies the second input signal to the second selected column line and the row output part receives a second output signal corresponding to the second input signal from a second selected row line, the row input part applies a third input signal corresponding to the second output signal received by the row output part to a third selected row line.

4. The electron device according to claim 1, wherein the row side circuit further comprises a first input switching circuit, and the first input switching circuit supplies any one of an output signal received by the row output part or an input signal supplied from the control component to the row input part, and
   the column side circuit further comprises a second input switching circuit, and the second input switching circuit supplies any one of an output signal received by the column output part or the input signal supplied from the control component to the column input part.

5. The electron device according to claim 1, wherein the row side circuit further comprises a first output switching circuit, and the first output switching circuit outputs an output signal received by the row output part towards the row input part or the control component, and
   the column side circuit further comprises a second output switching circuit, and the second output switching circuit outputs an output signal received by the column output part towards the column input part or the control component.

6. The electron device according to claim 1, wherein the row side circuit further comprises a row selecting circuit selecting a row line according to a row selecting signal, and
   the column side circuit further comprises a column selecting circuit selecting a column line according to a column selecting signal.

7. The electron device according to claim 1, wherein the row output part comprises a merged calculation part, merging currents flowing into one or more selected row lines; an analog-digital converter, converting analog voltages corresponding to the currents merged by the merged calculation part into digital signals; and a holding circuit, holding the digital signals converted by the analog-digital converter, wherein the row input part comprises a digital-analog converter generating analog voltages according to input digital signals, and
   the column output part comprises a merged calculation part, merging currents flowing into one or more selected column lines; an analog-digital converter, converting analog voltages corresponding to the currents merged by the merged calculation part into digital signals; and a holding circuit, holding the digital signals converted by the analog-digital converter, wherein the column input part comprises a digital-analog converter generating analog voltages according to input digital signals.

8. The electron device according to claim 1, wherein the crossbar array comprises a plurality of arrays, disposed in row and column directions; and switching circuits, disposed between adjacent arrays and performing electric coupling or non-coupling switching between the arrays in the row and column directions.

9. The electron device according to claim 8, wherein the row side circuit is disposed at an end of one side in the row direction of the crossbar array, and the column side circuit is disposed at an end of one side in the column direction of the crossbar array.

10. The electron device according to claim 1, wherein the control component comprises a programming component, and the programming component programs resistance values of the resistance-variable memory elements through the selected row lines and the selected column lines.

11. The electron device according to claim 10, wherein the programming component applies programming pulses of selected polarities to low-resistance-variable memory elements through the selected row lines and the selected column lines.

12. The electron device according to claim 10, wherein the control component controls the programming component corresponding to weighting of the resistance-variable memory elements.

13. A processing method for signals in an electron device using a crossbar array, wherein the crossbar array comprises m row lines, extending in a row direction; n column lines, extending in a column direction; and resistance-variable memory elements, coupling to each cross part of the m row lines and the n column lines, wherein the m row lines of the crossbar array electrically couple to a row side circuit, and the n column lines electrically couple to a column side circuit, the processing method comprising:

applying a first input signal to a first selected row line of the row side circuit, and outputting a first output signal corresponding to the first input signal from a first selected column line of the column side circuit; and applying a second input signal corresponding to the first output signal to a second selected column line of the column side circuit, and outputting a second output signal corresponding to the second input signal from a second selected row line of the row side circuit.

14. The processing method according to claim 13, further comprising applying a third input signal corresponding to the second output signal to a third selected row line of the row side circuit, outputting a third output signal corresponding to the third input signal from a third selected column line of the column side circuit; and applying a fourth input signal corresponding to the third output signal to a fourth selected column line of the column side circuit, and outputting a fourth output signal corresponding to the fourth input signal from a fourth selected row line of the row side circuit.

15. The processing method according to claim 13, further comprising applying programming voltages to the selected row lines and the selected column lines to program resistance values of the resistance-variable memory elements.

* * * * *